United States Patent [19]

Hayward

[11] 4,455,749

[45] Jun. 26, 1984

[54] MATRIX BOARD

[76] Inventor: C. Michael Hayward, 23 Jacob Gates Rd., Harvard, Mass. 01451

[21] Appl. No.: 314,578

[22] Filed: Oct. 26, 1981

Related U.S. Application Data

[60] Division of Ser. No. 64,372, Aug. 7, 1979, Pat. No. 4,330,684, which is a continuation-in-part of Ser. No. 864,457, Dec. 27, 1977, abandoned.

[51] Int. Cl.$^3$ ............................................. G09B 29/00
[52] U.S. Cl. ..................................... 33/1 B; 33/1 G; 434/224
[58] Field of Search ......... 33/1 B, 1 G, 1 AA, 174 B, 33/174 G; 434/224, 379, 416, 430; 339/17 B

[56] References Cited

U.S. PATENT DOCUMENTS

| | | | |
|---|---|---|---|
| 2,752,245 | 6/1956 | Hough et al. | 33/1 B |
| 2,942,973 | 6/1960 | Patrick | 33/1 B |
| 2,958,948 | 11/1960 | Dunkelberger | 33/174 B |
| 3,074,181 | 1/1963 | Watson | 434/224 |
| 3,789,507 | 2/1974 | Murray, Jr. | 33/1 B |
| 3,820,786 | 6/1974 | Candor | 33/1 B |
| 4,222,036 | 9/1980 | Troukens | 434/224 |

FOREIGN PATENT DOCUMENTS

135923 4/1960 U.S.S.R. ............................. 33/1 G

*Primary Examiner*—Richard R. Stearns
*Attorney, Agent, or Firm*—Schiller & Pandiscio

[57] ABSTRACT

A novel electrical interconnection system is described. The system includes a novel multiple-bussed matrix board and associated hardware and assembly tools for use therewith. The matrix board includes a plurality of plated-through holes arranged in a coordinate system of rows spaced 0.100 inches on center, measured from aperture-to-aperture. Selected apertures are electrically connected to selected bus bars on one or the other side of the board.

3 Claims, 13 Drawing Figures

U.S. Patent  Jun. 26, 1984  Sheet 3 of 5  4,455,749
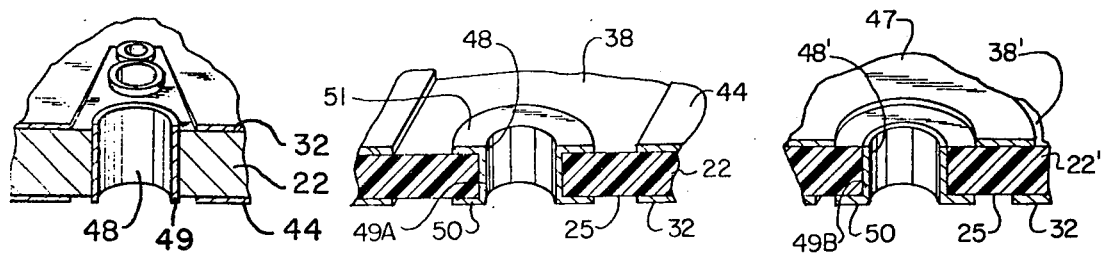
FIG. 3    FIG. 3A    FIG. 3B
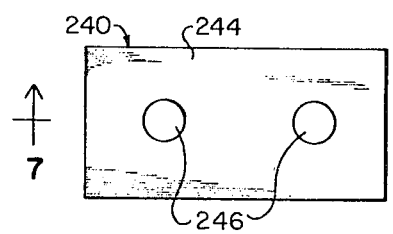   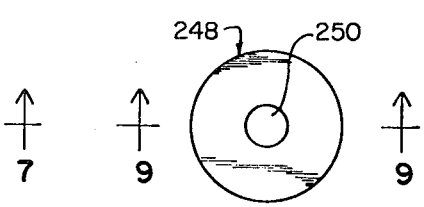
FIG. 6    FIG. 8
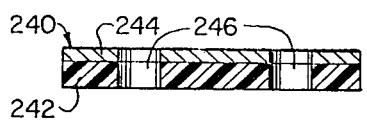   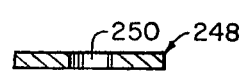
FIG. 7    FIG. 9
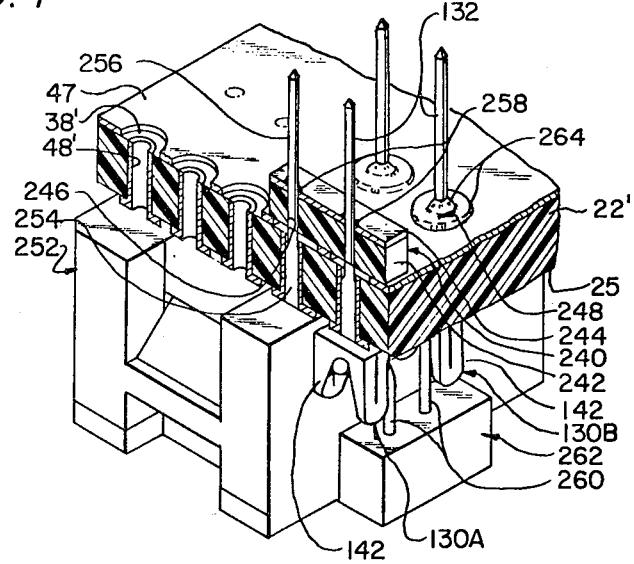
FIG. 10

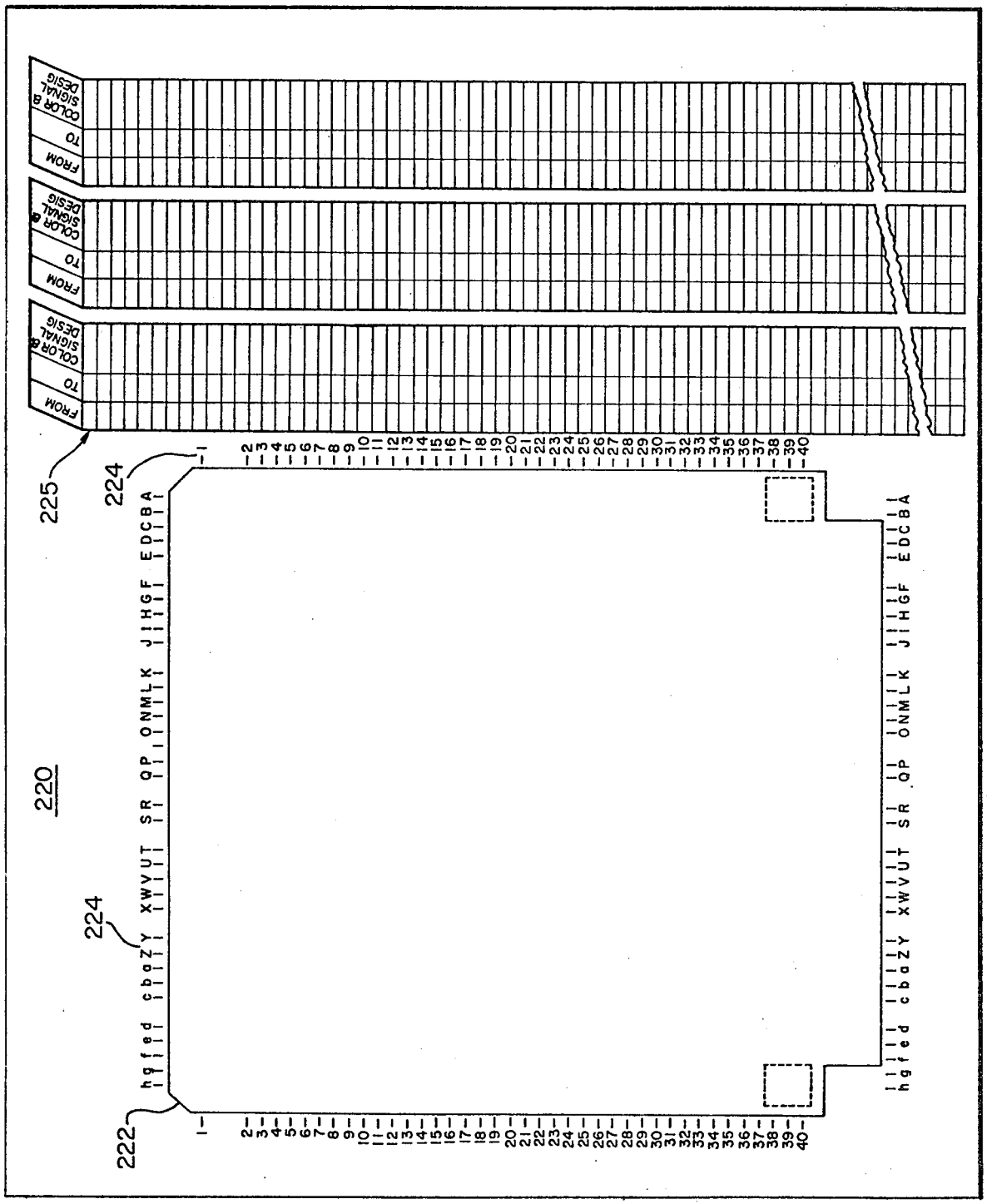

MATRIX BOARD

This application is a divisional application of copending application Ser. No. 64,372, filed Aug. 7, 1979 now U.S. Pat. No. 4,330,684, which in turn is a continuation-in-part of application Ser. No. 864,457, filed Dec. 27, 1977 now abandoned.

This application relates to electrical interconnection systems and more particularly to a novel system for assembling electronic circuits. More specifically this invention relates to a multiple-bussed matrix board and associated hardware and assembly tools.

Breadboarding of electronic circuits is a well known technique for proving the feasibility of a proposed electrical circuit. A conventional prior art breadboard may consist of a flat, relatively stiff dielectric sheet material such as 1/16 inch thick fiber board or epoxy glass. The dielectric sheet is perforated typically with apertures spaced on a 0.1 by 0.1 inch grid so as to permit insertion or removal of leads from electrical and electronic components and jumper wires, e.g. so that an electronic circuit can be laid out in order to test a new circuit and/or to facilitate changes, if necessary. Typically, the various components are laid out without regard to final location, the components are connected together in a desired circuit path by jumper wires, and the individual component leads and associated jumper wires are then electrically and mechanically connected, e.g. as by hand soldering in known manner. Although this form of breadboard offers considerable adaptability, in that any component may be positioned virtually anywhere on the board, it will be appreciated that the task of inserting each component lead and wire in appropriate position, and of maintaining the leads and wire in position until they can be soldered is somewhat difficult and laborious. Moreover, cutting the individual jumper wires to required length and stripping the insulation from the cut wire ends is labor intensive and may add appreciably to the cost of breadboarding a circuit. Breadboarding techniques may also be employed in industry for manufacturing custom electronics assemblies, and for low-volume production runs.

An improvement over conventional prior art breadboards is the so-called matrix or bus-bar board which is presently manufactured and available commercially from a number of manufacturers, including Augat, Inc., (Attleboro, Mass.), Excel Products Co., Inc. (New Brunswick, N.J.), Vector Electronic Co., Inc. (Sylmar, CA.), and others. Such commercially available boards generally comprise a perforated board of dielectric material such as epoxy glass with an electrically conductive metallic bus pattern on one surface of the board surrounding selected perforations typically arranged for specific types and sizes of components (e.g. 6 to 20 pin 0.3 inch dual in-line packages (DIPs), or 22 pin 0.4 inch DIPs, or 18 to 40 pin 0.6 inch DIPS, but not all simultaneously). In this connection, it will be recognized that a board perforated with apertures on a 0.1 by 0.1 inch grid will not readily accommodate a low resistance conductive metallic bus pattern between apertures, and consequently, a columnar arrangement of apertures spaced apart by a popular standard dimension is resorted to. In use, electrical components are assembled onto such boards with their leads extending through the board perforations. Also offered by the aforesaid and other manufacturers are various sockets and mounting pins for mounting discrete components and jumper wires on the board. Typically such sockets and pins are dimensioned so as to physically lock into the board perforations, e.g. as by frictional engagement with walls areas of the board defining the perforations. The discrete components may be affixed to the pins by soldering, while the jumper wires typically are affixed to the pins by a technique known in the art as wire-wrapping. (The term "wire-wrap" is a registered trademark of Gardner-Denver Company, Grand Haven, Mich., for a system for attaching jumper wires to a square-sectioned terminal post by tightly wrapping a bared end of the wire around the post).

By suitably positioning the various components on the board, the number of jumper wires required to complete a circuit may be substantially reduced. However, it should be noted that since the apertures are arranged on the board in pairs of columns spaced apart by one or more popular standard dimensions, the layout of apertures dictates the possible locations of interconnected components of differing sizes. As a consequence, jumper wires carrying diverse signals may perforce have paths which are longer than desirable and circuits on such boards may therefore exhibit cross-talk. Typically, such boards frequently require by-pass capacitors to be remote from the component to which they are connected.

It will be appreciated that such matrix boards are used not only to breadboard (i.e. form an experimental or test circuit) but also for short production runs where it would not be commercially feasible to manufacture the circuit in a standard commercial circuit board form. However, as noted, such boards readily accommodate only a limited number of component sizes, and thus do not offer the adaptability of earlier style breadboards.

A primary object of the present invention is to provide an improved interconnection system for electrical and electronic circuits. A more specific object is to provide an assembly system of the character described which, on the whole, is substantially simpler to use and therefore more economical than prior art systems.

A further object is to provide an assembly system which reduces the number of jumper wires, and the lengths of critical jumper wires, which may be required for a given circuit while nevertheless accommodating a wide variety of component sizes and styles, and thus offers the advantages of relative simplicity, reliability, flexibility and low cost as compared with prior art assembly systems.

Briefly described, the present invention consists, in one embodiment, of an assembly system which comprises a novel matrix board in the form of a substantially flat dielectric sheet or card having a unique coordinate pattern of plated-through apertures, and two or more electrically insulated voltage-distributing bus-bars formed on each of the opposite surfaces of the card. Also forming a part of the preferred embodiment of the invention are novel assembly tools for facilitating insertion of pins and components into apertures in the matrix board of the present invention.

Other objects and many of the attendant advantages of this invention are set forth or rendered obvious by the following detailed description. The invention accordingly comprises the apparatus possessing the construction, combination of elements and arrangement parts, which are exemplified in the following detailed description, and the scope of application of which will be indicated in the claims.

For a fuller understanding of the nature and objects of the present invention, reference should be made to the following detailed description taken in connection with the accompanying drawings in which like numerals depict like parts and wherein:

FIG. 3 is an enlarged cross sectional view, in perspective, of a selected portion of the matrix board of FIGS. 1 and 2;

FIG. 3A is an enlarged cross sectional view, in perspective, of an alternative embodiment of a selected portion of the matrix board of FIGS. 1 and 2;

FIG. 3B is an enlarged cross sectional view, in perspective, of a portion of the matrix board of FIGS. 1 and 2A;

FIG. 4 is a top plan view of an assembly master for use with the matrix board of FIGS. 1 and 2 to form a circuit in accordance with the present invention;

FIG. 6 is a top plan view of a jumper for use with the matrix boards of FIGS. 1, 2 and 2A;

FIG. 7 is a sectional view of the jumper of FIG. 6, taken along the line 7—7 of FIG. 6;

FIG. 8 is a top plan view of a washer for use with the matrix board of FIGS. 1 and 2A;

Figures 1, 2:
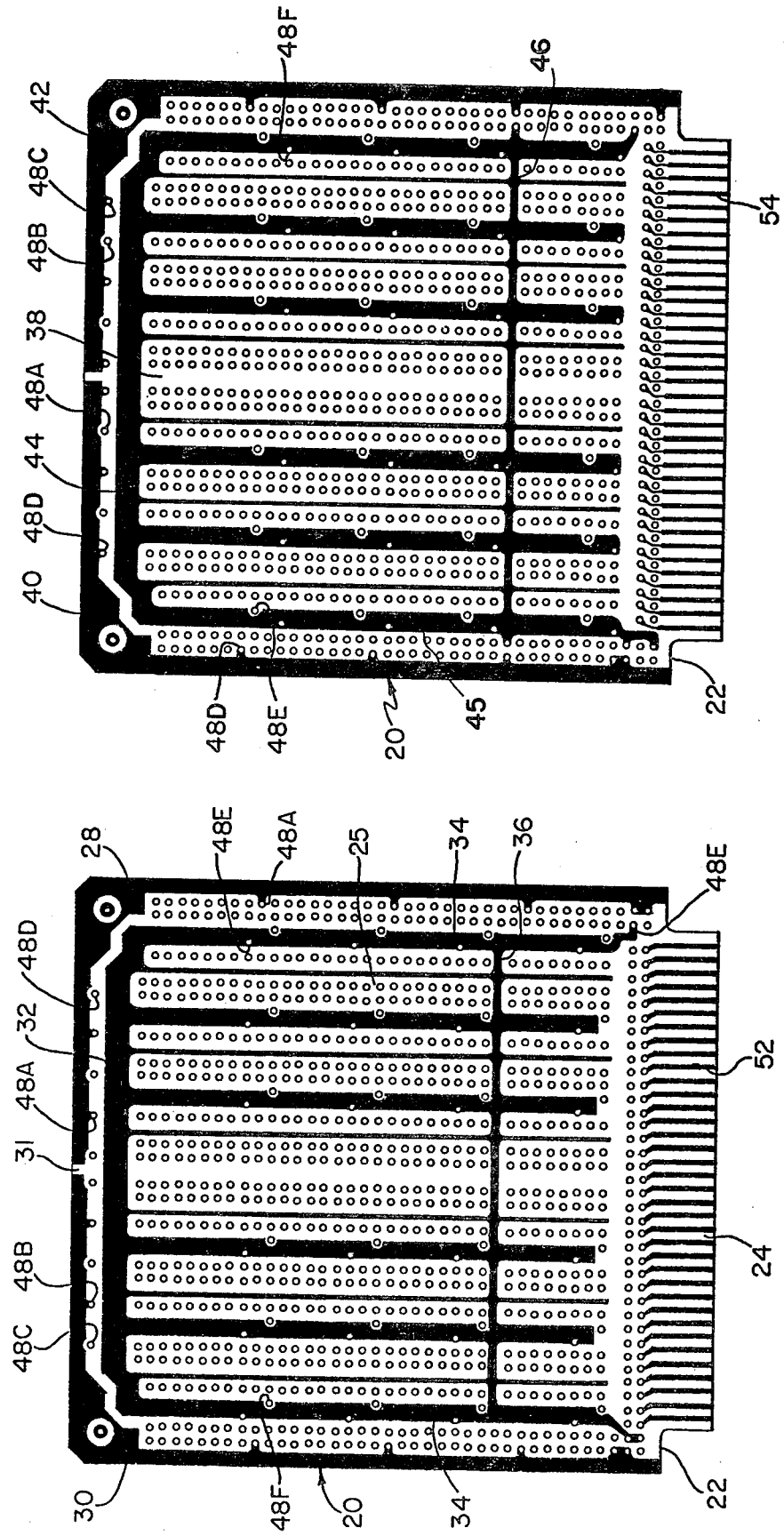
FIG. 1 is a top plan view of one surface of a preferred embodiment of a matrix board in accordance with the present invention.
FIG. 2 is a plan view of the opposite surface of the matrix board of the embodiment of FIG. 1.
Figure 2A:
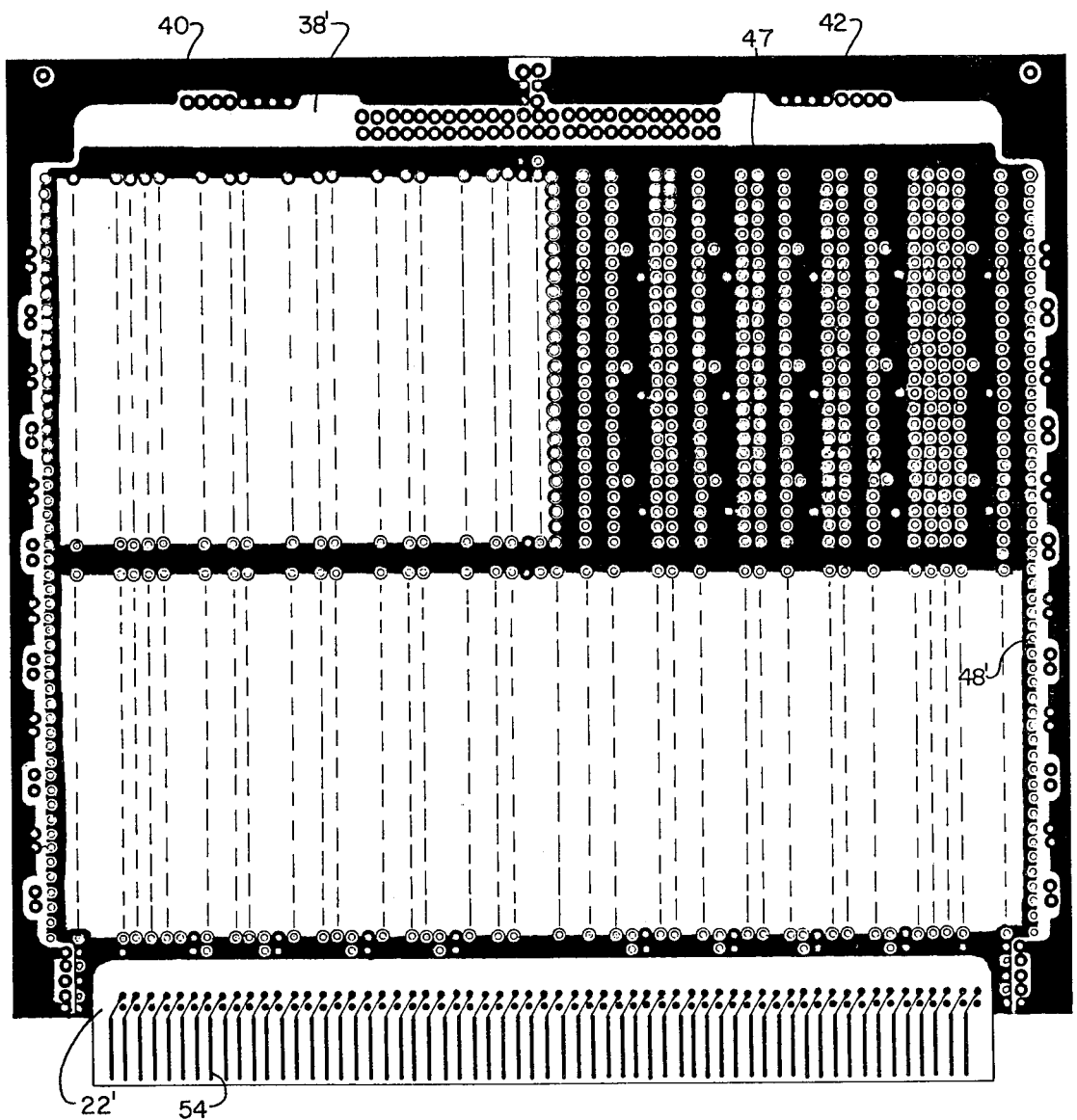
FIG. 2A is a plan view of an alternate embodiment of the opposite surface of the matrix board of FIG. 1.

FIG. 9 is a sectional view of the washer of FIG. 8, taken along the line 9—9 of FIG. 8; and FIG. 10 is a perspective view, partially in section, of a portion of the matrix board of FIGS. 1 and 2A, viewed from the side illustrated in FIG. 2A, showing the method of interconnecting components using the jumper of FIGS. 6 and 7 and the washer of FIGS. 8 and 9.

Referring to FIG. 1 of the drawings, there is illustrated a preferred embodiment of the matrix board of the invention, indicated generally at 20. Matrix board 20 comprises a substantially flat sheet or card 22 of rigid, electrically insulating material such as a phenolic resin, glass-epoxy or the like.

As shown in FIG. 1, card 22 has a generally square or rectangular plan. Formed along one edge of card 22 is an elongated tab 24, the purpose of which will become clear from the description following. A plurality of electrical conductors or bus bars are formed from a first flat surface 25 of card 22. An important feature of the present invention is the configuration of the bus bars which has been designed to provide maximum user flexibility for circuit building with a minimum requirement for jumper wires. Thus as seen in FIG. 1, the conductors include a power bus assembly in the form of a first and second power conductors disposed peripherally on surface 25 of card 22: a right-side bus 28 which extends adjacent the right side of card 22 and partially across top right-hand edge of the card, and a left-side bus 30 which extends adjacent the left side edge of the card and partially across the top left-hand edge of the card. Importantly, buses 28 and 30 are separated from one another by a small hiatus 31 located centrally at the top of card 22. For ease of discussion the terms "left", "right", "top", "bottom" and "central" are used to signify relative positions on the surface of card 22 as illustrated in FIG. 1. It will be understood however that the left and right, and top and bottom, etc. bus positions can be reversed in keeping with the present invention as will become clear from the discussion following.

A ground plane bus assembly comprises a main conductor or carrier bus bar 32 positioned on card 22 adjacent the top edge of the card and spaced and electrically separated from the top edge portions of power busses 28 and 30, respectively. A plurality of parallel spaced-apart fingers or branch bus bars 34 depend substantially in a normal direction from main carrier bus bar 32 parallel to the side edge portions of buses 28 and 30. Branch bus bars 34 also are electrically connected to one another by one or more bridges 36 adjacent their ends remote from the main bus bar 32.

Referring to FIG. 2 of the drawings, the opposite surface 38 of card 22 carries a pair of electrically conductive power bus bars 40 and 42 which are similar, but not identical to bus bars 28 and 30 but are registered therewith. Similarly, disposed on surface 38 is another ground plane assembly formed of main bus bar 44 corresponding to and registered with bus 32 and a plurality of branch bus bars 45 and an electrically connecting bridge 46 respectively corresponding to and registered with bars 34 and bridge 36.

It will be recognized that the ground plane assembly need not be limited to a rectilinear grid. For some purposes, such as very high frequency applications, branch bus bars 45 and connecting bridges 46 may be broadened to cover virtually all of the interior region of surface 38, thereby permitting relatively non-inductive ground paths. Such a configuration is shown as ground plane 47 in FIG. 2A. Ground plane 47 is disposed on surface 38' of card 22' so as to extend between each and every adjacent aperture 48', covering the region of surface 38' substantially opposite bus 32, bars 34, and bridge 36. As will be noted hereinafter, a more extensive ground plane 47 is made possible by configuring the plating of apertures 48' in a special way. In all other respects, card 22' is similar to card 22, as are surface 38' and apertures 48', with respect to surface 38 and apertures 48, respectively.

Matrix board 20 is provided with a plurality of plated-through holes or apertures 48. As may be seen by reference to FIG. 3, in its simplest form the plating is nothing more than a cylindrical lining 49 applied to the interior of the aperture. An alternative embodiment, particularly suited for use with card 22, is illustrated in FIG. 3A, where it may be seen that cylindrical lining 49A has been provided with connecting radial flanges 50 and 51, known as pads, disposed on surfaces 25 and 38 respectively. Another alternative embodiment, this one particularly suited for use with card 22', is illustrated in FIG. 3B, where it may be seen that lining 49B has been provided with a single connecting radial flange 50 disposed on surface 25. While, as will be described, a number of apertures 48 will have their plating electrically connected to selected power and ground busses, the majority will not. It will be understood therefore that the extent of flanges 50 and 51 must be so chosen as to permit adequate electrical separation between flanges of adjacent apertures and between flanges and adjacent busses. In the case of card 22', surface 38' has disposed upon it massive ground plane 47, and the lack of flanges or pads connected to linings 49B and extending over surface 38' permits ground plane 47 to extend closer to apertures 48' than would be the case if a flange were provided on this surface. In all other respects, linings 49A and 49B are similar to one another and to linings 49, as are apertures 48' to apertures 48.

As seen in FIGS. 1–2 the plated periphery of each of one or more of apertures 48 are individually electrically connected to a respective one of power buses 28, 30, 40 and 42, for example as at apertures 48A, 48B, 48C and 48D, respectively. Similarly each ground plane assembly formed of buses 32 and 44 are respectively connected to the plating in certain apertures 48, for example, apertures 48E and 48F. It should be noted thus that one end of the cylinder formed by the plating in each of these electrically connected apertures is in contact with a bus on one surface of card 22 (e.g. apertures 48A in FIG. 1 in contact with bus 28 on surface 25), the other end of the cylinder being exposed at the opposite surface on card 22 but electrically discrete from all buses and apertures on that opposite surface (e.g. apertures 48A in FIG. 2).

As seen in FIGS. 1 and 2 of the drawings the majority of plated-through apertures 48 are electrically discrete from one another and are also electrically discrete from the various bus bars. However, an important feature of the present invention is the pattern in which plated-through apertures 48 are arranged.

In accordance with the present invention, a plurality of apertures 48 are arranged on board 22 in a pattern or array which includes a series of parallel vertical columns of apertures in which the vertical spacing of the apertures center-to-center is 0.10" from one another except that where a column is interupted by bridge 36, the space across bridge 36 between adjacent apertures in a column on each side is 0.20".

It will be seen from FIG. 1 that the array of such vertical columns can be characterized according to the following discussion in which the columns are listed in numerical order starting from the first such column on the right hand margin of card 22 adjacent power bus 28. The apertures are identified by the individual number order in each column starting from the top (located just below ground plane bus bar 32), and counting down. The number of columns and apertures is merely examplary, and other numbers can readily be used. There are twenty-two columns of apertures, thirty-eight apertures appearing in each of the first, second, twenty-first and twenty-second columns. Thirty-five apertures appear in each of the third and twentieth columns. In the first column, the plating through of apertures nine, nineteen, twenty-nine, thirty-seven and thirty eight are directly electrically connected to power bus 28. The plating through aperture thirty-seven of the second column and apertures thirty-seven and thirty-eight of the twenty-first column are all directly electrically connected to adjacent ground plane branch bus bars 34. In column twenty-two, the plating through apertures nine, nineteen, twenty-nine, thirty-six and thirty-seven are each directly electrically connected to power bus 30.

Each of the remaining columns (i.e. the fourth through nineteenth) has thirty six apertures, the plating of none of which is electrically connected to any other aperture or bus bar on either side of the card.

The center lines of all of the columns are parallel to one another and are spaced from one another from right to left in FIG. 1, by a sequence of interspaces between the first and eleventh columns by 0.10, 0.30, 0.20, 0.10, 0.30, 0.20, 0.10, 0.30, 0.20 and 0.10 inches respectively. The order of spacing between the twenty second and twelfth columns is the same sequence but reading from left to right. The center lines of the eleventh and twelfth columns are separated by an interspace of 0.20". Branch bus bars 34 are disposed in all of the interspaces of 0.20 and 0.30 inches except for the interspace separating the eleventh and twelfth columns.

In addition, there is a row of ten apertures of the type hitherto described, lying approximately between ground plane bus bar 32 and the top extensions of power buses 28 and 30, six of which apertures are not electrically connected to any of the buses on surface 25 but rather to busses on surface 38. Of the remaining four, two apertures 48A are electrically connected to power bus 28 and two apertures 48B are electrically connected to power bus 30.

Similarly, there is a row of apertures (the plating through each of which is electrically connected to a respective ones of branch bus bars 34) disposed across the card in a line running through the ninth apertures of columns four through nineteen inclusive. Similar rows of apertures, electrically connected to respective ones of branch bus bars 34, extend across the card along lines corresponding to the center of apertures seventeen, twenty-five and thirty-three of columns four through nineteen inclusive.

Also disposed in rows across the card are apertures lying in the 0.30" interspaces along lines corresponding to the centers of the eleventh, nineteenth, twenty seventh and thirty fifty apertures of columns four through nineteen inclusive, the plating through the apertures of these rows however being electrically separated from connection with any of branch bus bars 34 in FIG. 1.

Lastly, there are a pair of rows of thirty-six plated-through apertures each of the apertures in each such row lying along the line perpendicular to the columns of apertures and spaced center-to-center by 0.10" apart. Extending perpendicularly to the last mentioned two rows of apertures are a corresponding number of electrical leads 52, preferably plated onto tab 24, each respectively directly electrically connected to the plating of a corresponding one of the apertures in the bottommost row.

As seen in FIG. 2, a similar row of thirty six plated leads 54 is formed on the other surface 38 of tab 24, each of leads 54 being directly electrically connected to a corresponding one of the apertures in only the second row.

Referring further to FIG. 2 it will be seen that the arrangement of other rows and columns of apertures 48 is (as expected in view of the fact that apertures 48 all extend through board 22 from surface 25 to surface 38) identical to that of FIG. 1 except of course reversed left-to-right. However the connections of apertures 48 to the various buses are somewhat different, for example as heretofore noted regarding apertures 48C, 48F and the like, so that those apertures 48 coupled on one side of the board to a bus are electrically discrete from any bus on the other side of the board.

One skilled in the art will recognize the aforesaid configuration of plated-through apertures and busses allows coupling or by-passing, as desired, between the various busses on one or both surfaces of the matrix board 20 in any combination. Thus, for example, assuming power bus assembly is selected as a power source for analog circuits, right-side bus 28 may be employed as the positive power supply and the left-side bus 30 as the negative power supply (see FIG. 1). Then, as shown in FIG. 2, right-side bus 42 on the other side of the card can comprise a source for logic circuitry and left-side bus 40 the negative power for the logic.

Should the analog circuit require a larger power supply, for example side edge buses, e.g. 28 and 30, may be joined at the top center of the bus at 31 by a suitable jumper wire (not shown) to provide a positive supply. A similar jumper in FIG. 2 will serve to join buses 40 and 42 if desired to provide the negative power supply, the entire card then containing analog circuitry. Other combinations will be obvious to one skilled in the art.

Another advantage of the aforesaid configuration and spacing of plated-through apertures at integral multiples (i.e. 1, 2 and 3) of 0.10" on center is that the board lends itself to installation of most standard electrical or electronic components, including standard integrated circuit dual in-line packages (DIPs) and sockets, trim pots, coils, resistors, capacitors, transistors, etc., without the need for special component carriers. Not only can the board accommodate a variety of sizes of components, but any component may be located virtually anywhere on the board, inasmuch as every region of the board can accommodate all standard sizes of component. Thus, not only can maximum density packing be accomplished, but the layout of components of various sizes may be made in accordance with the needs of the electronic circuit, and not as the board dictates.

It will be understood by those skilled in the art that the plating-through of apertures 48 serves a number of functions. Such an aperture will accommodate a tight-fitting rectangular sectioned component pin through the cold flow of the plating material, rather than through the abrasion of the card 22 material, as would be the case with unplated apertures. Thus plated-through apertures may be used to secure, through friction, component pins of a given size even after the apertures have been repeatedly staked and unstaked during breadboarding. Further the plating serves as a heat sink, thereby protecting the material of card 22 from damage during any soldering or unsoldering operations when components are secured or removed from component pins staked through the card. Further, the plating can serve as an electrical conductor, connecting component pins to selected busses. Finally, the plating itself may be secured by solder to a component pin, forming a more secure, albeit separable, mechanical and electrical bond. In all of these functions, it will be appreciated that flanged linings 49A and 49B are superior to unflanged lining 49.

Referring now to FIGS. 6 and 7, there may be seen a jumper 240 made in accordance with the principles of the present invention. Jumper 240 comprises a substantially flat thin wafer 242 of rigid, electrically insulating material, such as a phenolic resin, glass-epoxy, or the like, which, in a preferred embodiment is substantially rectangular in plan with a length slightly less than 0.2 inch and a width somewhat under 0.1 inch. An electrically conductive bus 244 is formed on one of the 0.2 by 0.1 inch surfaces of wafer 242. Jumper 240 is provided with a pair of holes or apertures 246 spaced 0.1 inch center-to-center and located along the longitudinal axis of the jumper equidistant from the transverse axis. Apertures 246 have diameters on the order of 0.04 inch, in order to readily accept component pin stems having a nominal cross section 0.025 inch on a side. The apertures penetrate completely through wafer 242 and bus 244.

FIGS. 8 and 9 illustrate a washer 248 for use with the present invention. Washer 248 is of a rigid electrically conductive material, such as brass, and may be solder plated, as may the electrically conductive parts of the other components described herein, in order to aid in the assembly operations as will be described hereinafter. In a preferred embodiment, washer 248 is somewhat less than 0.1 inch in outside diameter. Washer 248 is provided with a centrally located hole or aperture 250. Aperture 250 has a diameter on the order of 0.04 inch, in order to readily accept square-sectioned component pin stems having nominal dimensions of 0.025 inch squared. Aperture 250 penetrates completely through washer 248.

Turning now to FIG. 10, there may be seen a portion of an assembly of electronic components using the board, component pins, jumper, and washer of the present invention. An IC (DIP) socket 252, shown in part, has been placed on surface 25 of card 22', with pins 254 extending through selected apertures 48'. In an aperture 48' adjacent a selected pin 254, a component pin 130, identified in FIG. 10 as pin 130A for clarity, has been provided, with its slotted head 142 on the same side of the matrix board as socket 252. The selected pin 254 and adjacent component pin 130A are connected together through jumper 240. The jumper is mounted with wafer 242 in contact with ground plane 47 and so located that stem 256 of the selected pin 254 penetrates the jumper through one aperture 246 while stem 132 of component pin 130A penetrates the jumper through its other aperture 246. The stems of these two pins are mechanically and electrically connected to bus 244 of jumper 240 by beads of solder 258 between the stems and the bus. One of two electrical leads 260 of capacitor 262 is affixed, with solder, to slotted head 142 of component pin 130A. Another component pin 130, indicated for clarity as pin 130B in FIG. 10, is provided to similarly attach to the other lead 260. Component pin 130B is attached to card 22' in a manner similar to pin 130A and spaced apart from pin 130A a sufficient distance to accommodate capacitor 262. The stem 132 of pin 130B passes through aperture 250 of washer 248. Washer 248 is soldered, by beads 264, to both stem 132 of pin 130B and ground plane 47.

It will be noted that pin 130A and the adjacent pin 254, while passing through card 22' and ground plane 47 and being electrically connected together on the ground plane side of the card are nevertheless electrically separated from the ground plane by the spacing between the ground plane and plated through apertures 48' and by the insulation provided between the ground plane and bus 244 by wafer 242.

More importantly, it will be noted that the pattern of apertures 48' has allowed capacitor 262 to be placed immediately adjacent the IC terminal to which it is connected, the distance in the present case being 0.1 inch, rather than the up to half an inch commonly encountered in prior art matrix boards. As a consequence, matrix boards made in accordance with the present invention offer superior high frequency performance in that they permit filter capacitors to be connected to other circuit elements through a low-inductance lead.

The matrix board disclosed above and as shown in FIGS. 1 and 2, is particularly useful in a system which permits one to design a circuit on paper and translate the design into finished, documented hardware with effective configuration control throughout assembly and testing. For prototypes and special systems, this means that breadboarding can be eliminated and hardware assembled and debugged in the final configuration, even if extensive changes are anticipated. The result will be hardware ready for shipment supported by complete documentation for instruction manuals and follow-on production. For breadboarding this means fast, economical and error free assembly of breadboards with minimum engineering supervision. During the design and debugging phase an accurate record of all changes can be kept and related to the test results.

It should be noted that the high degree of adaptability of the matrix board of the present invention is due to the large number of plated through apertures arranged in columns variously spaced apart. In any one application, a large number of the apertures will not be used, and the documentation system used for planning or recording the layout must provide for the accurate depiction of the apertures used, while avoiding the obscuration of detail through the representation of the large number of unused apertures.

Figure 5:
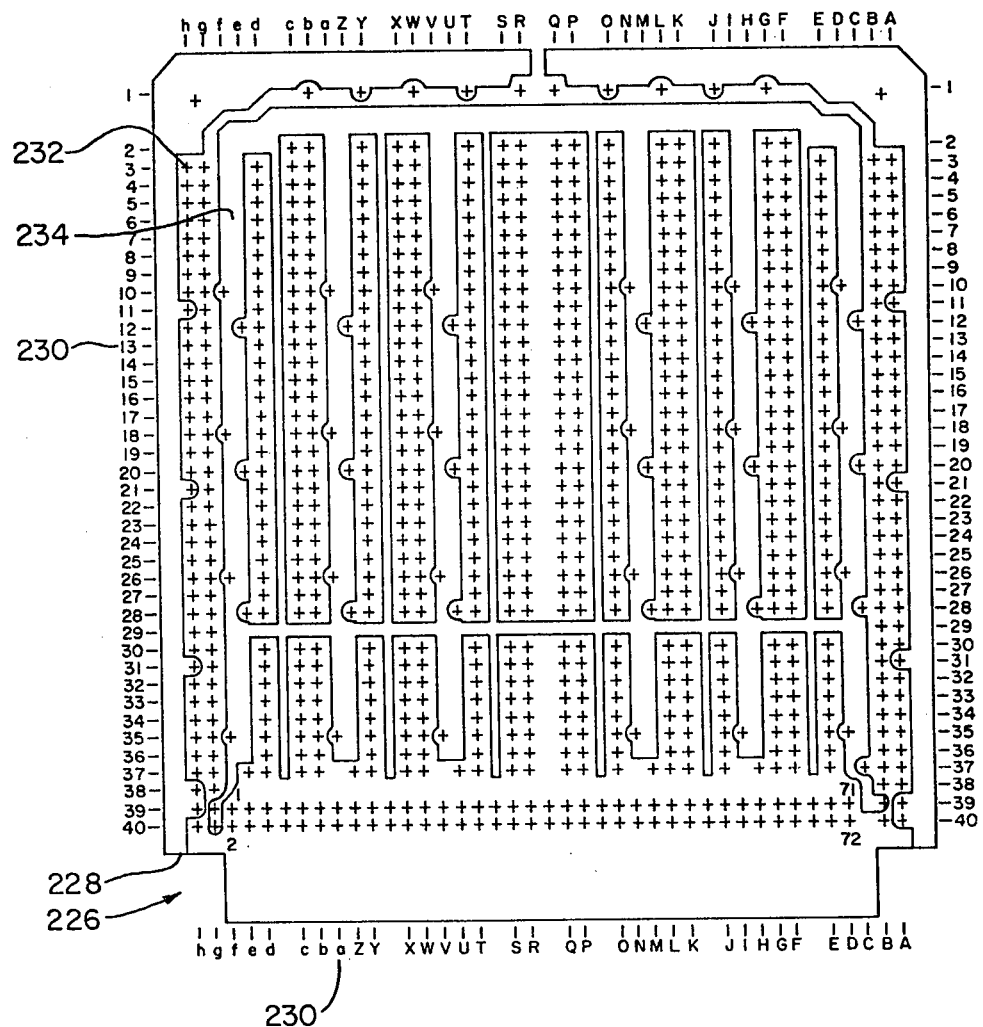
FIG. 5 is a top plan view of a location and grid corresponding to the board of FIG. 1 for use with the assembly master of FIG. 4.

To this end there is provided as shown in FIG. 4 assembly master 220 in the form of a translucent or transparent sheet which has thereon a printed layout of the outline 222 of board 220, printed coordinate system 224 for identifying locations on outline 222, and space 225 for a wire-run list. Alternatively, the wire-run list may be complied on a separate sheet. Also, as shown in FIG. 5, there is provided location grid 226 in the form of a separate sheet bearing outline 228 of board 20, of the same dimensions as outline 222 and bearing coordinate system 230 which is identical to system 224. Grid 226 also however includes indicia such as 232 corresponding to the location of each aperture on board 20, and other indicia such as 234 corresponding to the portion of buses on board 20.

Master 220 is designed to be superimposed over grid 226 so that the portion of each electronic component can be marked on outline 222. Thus, highly professional layout drawings and wiring charts can be prepared by technicians. The resultant assembly drawing can then be given to production assembly type personnel for assembly of components and hand wire-wrapping.

If there is access to an automatic wire-wrap facility, the necessary programming can be accomplished directly from the assembly drawing run list since this document and the card have been designed for automatic wire-wrapping.

The Parts List complements the assembly master and is organized to provide complete information such as part descriptions, part numbers, quantities, etc.

Various changes may be made in the above processes and products without departing from the scope of the invention herein involved. For example, the matrix board may be lengthened, e.g. so that the various rows of apertures include additional plated-through apertures. Obviously the various buses should be lengthened accordingly. It is therefore intended that all matter contained in the foregoing description shall be interpreted in an illustrative and not in a limiting sense.

What is claimed is:

1. A system for designing prototype electrical circuits on a matrix board of the type comprising an insulated mounting board having a plurality of apertures extending through said board between the first and second surfaces of the board, a plurality of electrical conductors physically mounted on the first or second surface of said board, and a coordinate system including indicia for identifying locations on said board, said system comprising, in combination:

an assembly master in the form of a light-transmitting sheet having disposed thereon (1) an outline of said matrix board, and (2) a coordinate system which is substantially identical to the coordinate system carried on said matrix board; and a location grid in the form of a sheet having disposed thereon (1) an outline of said matrix board dimensioned substantially identically to the outline disposed on said master, (2) a coordinate system substantially identical to that carried on said assembly master, (3) first indicia substantially corresponding to the location of each aperture in said matrix board and (4) second indicia substantially corresponding to the location of each electrical conductor on said matrix board.

2. A system in accordance with claim 1, wherein said assembly master and said location grid comprise separate sheets.

3. A system in accordance with claim 1, and further including a printed parts list carried on said assembly master.

* * * * *